United States Patent
Mertel et al.

(10) Patent No.: US 8,963,560 B2
(45) Date of Patent: Feb. 24, 2015

(54) ANTENNA SYSTEM FOR ELECTROMAGNETIC COMPATIBILITY TESTING

(75) Inventors: Michael Edward Mertel, Bellevue, WA (US); James E. Thomas, Issaquah, WA (US)

(73) Assignee: Steppir Antenna Systems, Bellevue, WA (US)

( * ) Notice: Subject to any disclaimer, the term of this patent is extended or adjusted under 35 U.S.C. 154(b) by 434 days.

(21) Appl. No.: 13/210,224

(22) Filed: Aug. 15, 2011

(65) Prior Publication Data

US 2013/0043885 A1   Feb. 21, 2013

(51) Int. Cl.
  G01R 27/04 (2006.01)
  G01R 31/02 (2006.01)
  H01Q 21/12 (2006.01)
  G01R 29/08 (2006.01)

(52) U.S. Cl.
  CPC .................................. *G01R 29/0878* (2013.01)
  USPC ............................. 324/629; 324/539; 343/815

(58) Field of Classification Search
  CPC ........... H01Q 3/24; H01Q 7/00; H01Q 9/265; H01Q 9/27; G01R 31/3025; G01R 29/10
  USPC .......................................... 324/629; 343/815
  See application file for complete search history.

(56) References Cited

U.S. PATENT DOCUMENTS

| | | | |
|---|---|---|---|
| 2,594,328 A * | 4/1952 | Marchetti | 343/766 |
| 2,641,703 A * | 6/1953 | Valach | 343/803 |
| 2,660,675 A * | 11/1953 | Amen | 343/815 |
| 2,703,840 A * | 3/1955 | Carmichael | 343/815 |
| 3,321,764 A * | 5/1967 | Winegard et al. | 343/815 |
| 3,748,582 A * | 7/1973 | Ohsawa | 455/155.1 |
| 3,753,120 A * | 8/1973 | Ohsawa | 455/155.1 |
| 4,398,201 A * | 8/1983 | Winegard et al. | 343/815 |
| 4,580,092 A | 4/1986 | Squire | |
| 6,034,638 A * | 3/2000 | Thiel et al. | 343/702 |
| 6,067,054 A * | 5/2000 | Johannisson et al. | 343/816 |
| 6,661,237 B2 * | 12/2003 | Teich | 324/539 |
| 6,677,914 B2 * | 1/2004 | Mertel | 343/815 |
| 6,911,947 B1 | 6/2005 | Cranor et al. | |
| 7,312,758 B2 | 12/2007 | Seybold | |
| 7,463,211 B2 * | 12/2008 | Mertel et al. | 343/815 |

(Continued)

OTHER PUBLICATIONS

Notification of Transmittal of the International Search Report and the Written Opinion of the International Searching Authority, or the Declaration, the International Search Report and the Written Opinion mailed Oct. 10, 2012 in corresponding International Patent Application No. PCT/US2012/049382, 8 pages.

*Primary Examiner* — Jermele M Hollington
*Assistant Examiner* — Christopher McAndrew
(74) *Attorney, Agent, or Firm* — Leech Tishman Fuscaldo & Lampl; Kenneth D'Alessandro

(57) ABSTRACT

An antenna system for electromagnetic compliance testing within a frequency range includes a driven element mounted on a boom and including opposed first and second length-adjustable conductors. A length-adjustable passive element is mounted on the boom and spaced apart from the driven element and including opposed third and fourth length-adjustable conductors. An RF input connector is coupled between a feed path to a feed end of each length-adjustable conductors in the driven element. The feed path is configured to minimize stray reactances and stub effects within the frequency range.

12 Claims, 3 Drawing Sheets

(56) References Cited

U.S. PATENT DOCUMENTS

| | | |
|---|---|---|
| RE42,087 E | 2/2011 | Mertel |
| 2007/0229386 A1 | 10/2007 | Mertel et al. |
| 2008/0090539 A1* | 4/2008 | Thompson .................. 455/250.1 |
| 2011/0018553 A1 | 1/2011 | Webb |
| 2011/0057848 A1* | 3/2011 | Baucom et al. ............... 343/705 |
| 2011/0084887 A1 | 4/2011 | Mow et al. |

* cited by examiner

ANTENNA SYSTEM FOR ELECTROMAGNETIC COMPATIBILITY TESTING

BACKGROUND

1. Field of the Invention

The present invention relates to antenna systems. More particularly, the present invention relates to antenna systems that are particularly useful for electromagnetic compatibility (EMC) testing.

2. The Prior Art

EMC testing systems are known in the art. EMC testing is used for radiation and susceptibility testing of electronic devices. Radiation testing is used to determine how much RF energy is radiated by electronic devices while they are operating. In the radiation mode of testing, the antenna is used as a receive antenna. Susceptibility testing is used to determine how much RF energy a device can be exposed to before it malfunctions. In the susceptibility mode of testing, the antenna is used as a transmitting antenna.

Susceptibility testing starts at 30 MHz and at that frequency a very large shielded room is required to accommodate a reasonably efficient antenna such as a half wave dipole, which is 16 feet wide at this frequency. These rooms are not practical for the vast majority of test facilities. In addition, because the testing is performed at frequencies up to at least several hundred megahertz, the presently used antenna systems must be broadbanded enough to operate over these ranges.

Presently-available broadband EMC antennas used for susceptibility testing include bi-conical antennas and log periodic arrays. Such antennas are inefficient and can also be expensive. These antennas are paired with RF amplifiers in EMC systems the total cost of which can exceed $500K to $700K. Because presently-available systems are so inefficient, the amplifiers have to be run at extremely high power levels (e.g., in excess of 5 KW). At such power levels, coupled with extreme impedance mismatches between the amplifier and antenna, the EMC antenna sometimes radiates more energy at the second or third harmonic than at the fundamental frequency of interest. This setup badly skews the test results and often renders them invalid according to the existing testing standards.

Other antennas such as e-field radiators, also known as billboard antennas, are sometimes used for susceptibility testing but cannot totally illuminate the device under test. These antennas are thus very inefficient because the test must be repeated. In addition, the test cannot always be performed according to the existing testing standards.

There currently exists a need in the EMC industry for EMC test systems that can generate very high E fields to facilitate susceptibility testing and that conform to new stricter standards which specify that little or no harmonic energy be present. As previously noted, presently-available antenna/amplifier combinations require impractical power levels and require moving the antenna many times at every frequency test point to cover the required illumination of the Equipment Under Test (EUT). This requires many additional hours to perform the test. Additionally, using the presently-available antenna/amplifier combinations results in radiating energy at harmonic frequencies at power levels often exceeding the desired test frequency.

Adjustable antennas using flexible elements currently known in the art have attributes that could make them viable candidates for solving these long known problems in EMC susceptibility testing, but their basic design severely limits their upper frequency limit. Testing standards, such as MIL-STD-461F, require 200V/meter fields, with the antenna one meter away, from 30 MHz to 200 MHz, which is very difficult to achieve with available equipment. Current adjustable-frequency antenna designs, such as those disclosed and claimed in U.S. Pat. No. RE42,087, employ stepper motors to drive copper tape from reels. The reels are in close proximity to each other, resulting stray capacitive and inductive coupling between the element halves that is substantial within the frequency range of EMC testing systems. This limits current designs to an upper frequency limit of about 55 MHz.

In addition, the use of brushes contacting the metal tape to couple the RF energy to and from the tape does not allow the RF to be transferred directly to the starting point of each element resulting in the inadvertent formation of an RF "stub" that can make the system inoperable at various frequencies in the 30 MHz to 200 MHz range.

A second deficiency of current adjustable antennas using elements that loop back on themselves to shorten the width of the antenna is that many shielded rooms are still not large enough to accommodate them even with the 40% shorter elements these antennas provide.

Shielded rooms cause a multitude of "room effects" that severely affect the input impedance of the antenna resulting in very high standing waves that put a tremendous strain on the amplifier, but more importantly cause the harmonic output of the amplifier to be greatly increased.

BRIEF DESCRIPTION OF THE INVENTION

According to one aspect of the present invention, an antenna system for electromagnetic compliance testing within a frequency range includes a driven element mounted on a boom and including opposed first and second length-adjustable conductors. A length-adjustable passive element is mounted on the boom and spaced apart from the driven element and including opposed third and fourth length-adjustable conductors. An RF input connector is coupled between a feed path to a feed end of each length-adjustable conductors in the driven element. The feed path is configured to minimize stray reactances and stub effects within the frequency range.

According to another aspect of the present invention, an antenna system for electromagnetic compliance testing includes a plurality of antenna elements, at least some of which are arranged in a loop or folded configuration to allow them to fit in a smaller testing chamber.

According to yet another aspect of the present invention, an antenna system for electromagnetic compliance testing includes a plurality of antenna elements, at least some of which are have ends oriented at an angle with respect to the plane of the elements.

According to a further aspect of the present invention an antenna system for electromagnetic compliance testing includes a tunable antenna according to the present invention coupled through an SWR measuring device to an RF amplifier that is mounted on or in close proximity to the antenna. An output signal from the SWR measuring device is coupled to an antenna tuning controller coupled to the antenna elements to adjust their lengths for minimum SWR. An e-field meter is positioned to receive radiation emitted from the antenna. An output signal from the e-field meter is coupled to a control unit through a RF signal conditioning circuit. The control unit receives input from a user and adjusts a signal generator coupled to feed RF energy into the RF amplifier and also adjusts the RF amplifier to generate an RF signal at the e-field meter of a selected frequency at a selected field strength.

BRIEF DESCRIPTION OF THE DRAWING FIGURES

DETAILED DESCRIPTION

Persons of ordinary skill in the art will realize that the following description of the present invention is illustrative only and not in any way limiting. Other embodiments of the invention will readily suggest themselves to such skilled persons.

Figure 1:
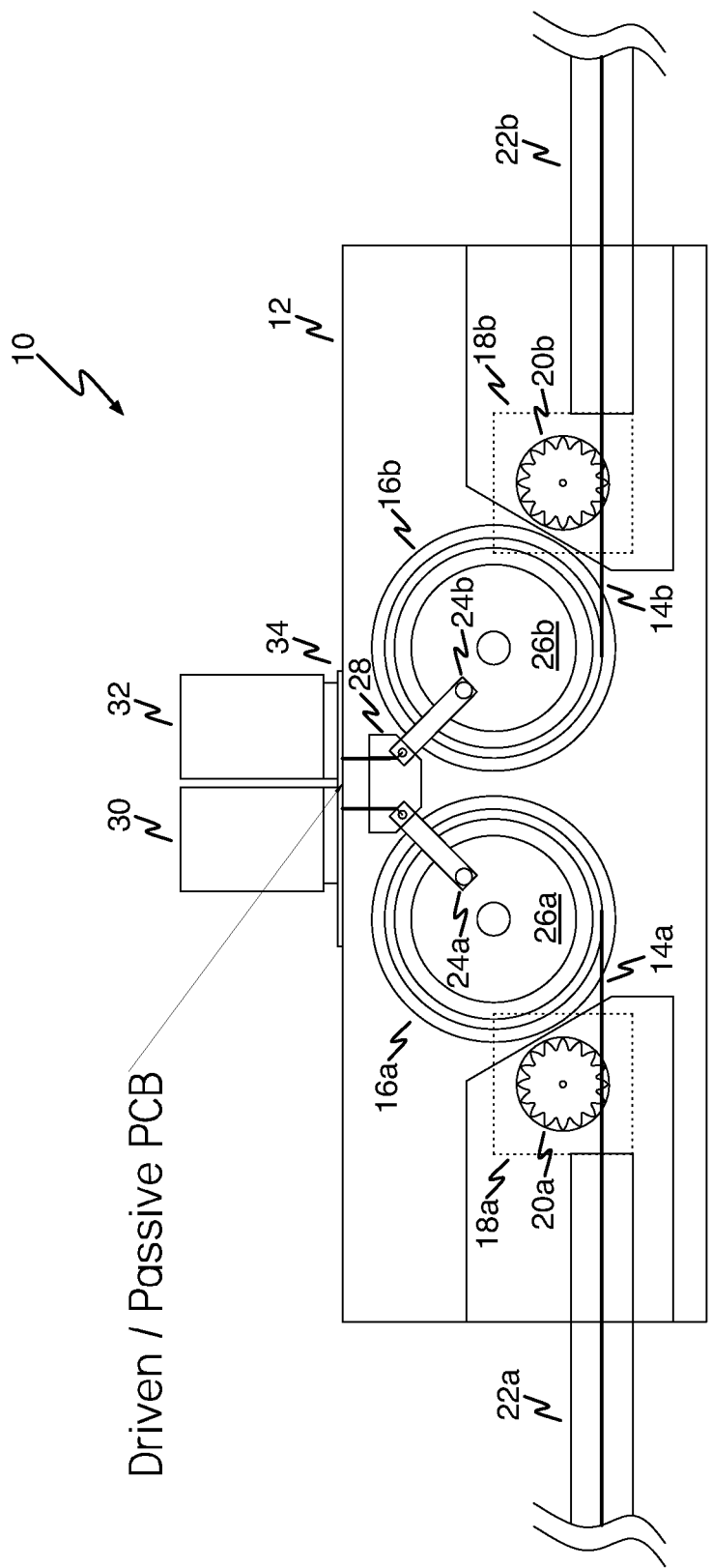
FIG. 1 is a diagram showing a length-adjustment mechanism for an illustrative adjustable EMC antenna according to the present invention.

Referring first to FIG. 1, a diagram shows a length-adjustment mechanism 10 for an illustrative adjustable EMC antenna according to the present invention. Length-adjustment mechanism 10 is mounted on a frame or housing 12. An opposed pair of length-adjustable elements 14a and 14b are preferably formed from a conductive material such as perforated beryllium-copper alloy tape fed from respective reels 16a and 16b by stepper motors 18a and 18b. Sprocket drive wheels 20a and 20b are preferably used to engage holes formed in the length-adjustable elements 14a and 14b to prevent slippage of the conductive material so that their lengths can be precisely controlled by the stepper motors.

The length-adjustable elements 14a and 14b are directed into hollow tubes 22a and 22b. Details of the operation of the mechanism described so far are known in the art and are described in U.S. Pat. No. RE42,087 as well as being observable as employed in various adjustable antenna products marketed and sold under the trademark "Steppir" by Fluid Motion, Inc., of Bellevue, Wash. Further description of the construction and operation of this mechanism will not be presented here to avoid unnecessarily overcomplicating the disclosure.

For operation under typical EMC testing conditions, the antenna element length-adjustment mechanisms of the prior art present several problems including reactive coupling and inadvertent RF stub formation as noted above. These problems are overcome by the present invention. RF energy is coupled into the length-adjustable elements 14a and 14b by brushes 24a and 24b that make contact with conductive flat surfaces at the top edges of reels 26a and 26b. The brushes are mounted on a block 28 formed from a dielectric material that is inert with respect to RF within the frequency range of interest.

In a presently preferred embodiment the reels 26a and 26b are formed entirely from a conductive material such as silver-plated brass. The reels 26a and 26b are preferably mounted in the same horizontal plane and are spaced apart from one another so as to substantially reduce or eliminate any reactive coupling between them. Also, because the brushes 24a and 24b are located towards the inner edges of reels 26a and 26b, the possibility of inadvertently creating parasitic RF stubs is substantially eliminated within the frequency range of interest.

The length-adjustable elements 14a and 14b of the present invention may be configured as driven elements or as passive elements. When length-adjustable elements 14a and 14b are employed as driven elements, RF energy is coupled into the brushes 24a and 24b by RF input relay 30. If used alone, they function together as a dipole antenna when oriented as shown in FIG. 1. When length-adjustable elements 14a and 14b are employed as passive elements, shorting relay 32 is used to connect brushes 24a and 24b together. RF input relay 30 and shorting relay 32 may be mounted on a circuit board 34. Persons of ordinary skill in the art will appreciate that circuit board 34 should be formed from a material that is compatible with high frequencies expected to be encountered during use of the antenna system of the present invention.

Figure 2:
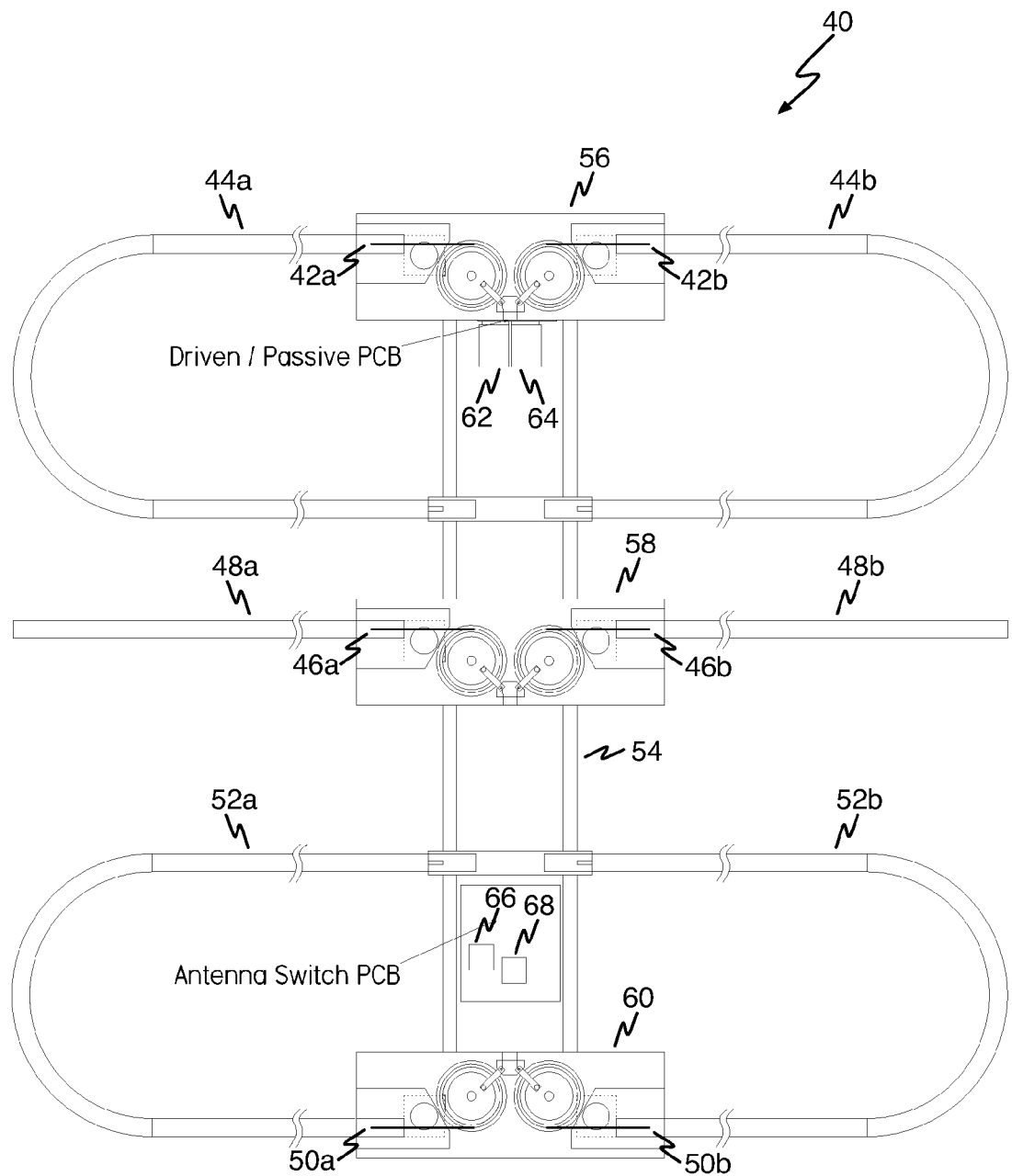
FIG. 2 is a diagram showing an illustrative adjustable EMC antenna according to the present invention.

In a typical EMC testing configuration, a number of length adjustment mechanisms 10 of FIG. 1 can be arrayed into a more complicated antenna design, such as a yagi antenna. Referring now to FIG. 2, a diagram shows an illustrative adjustable multi-element EMC antenna 40 according to the present invention.

Multi-element EMC antenna 40 includes three length-adjustable element pairs 42a and 42b fed into tubes 44a and 44b, 46a and 46b fed into tubes 48a and 48b, and 50a and 50b fed into tubes 52a and 52b, respectively, mounted on a boom 54. In one embodiment of the invention, the configuration shown in FIG. 2 may be used over a frequency range such as 30 MHz to 200 MHz, although persons of ordinary skill in the art will appreciate that, by appropriate scaling, such a configuration could be made to operate over other frequency ranges.

Persons of ordinary skill in the art will observe that tubes 44a and 44b and 52a and 52b are both formed in a loop configuration. Such a configuration is described in U.S. Pat. No. 7,463,211 as well as being observable as employed in various adjustable antenna products marketed and sold under the trademark "Steppir" by Fluid Motion, Inc., of Bellevue, Wash. Further general description of the construction and operation of such loop elements will not be presented here to avoid unnecessarily overcomplicating the disclosure.

Each of length-adjustable elements 42a and 42b, 46a and 46b, and 50a and 50b, respectively, are controlled by length-adjustment mechanisms 56, 58, and 60 which may be formed as described with reference to FIG. 1 herein. Persons of ordinary skill in the art will observe that because of the loop construction of the tubes 44a and 44b and 52a and 52b enclosing element pairs 42a and 42b and 50a and 50b, the maximum length of these elements is about twice that of element 46a and 46b.

Accordingly, over a first portion of the frequency spectrum within which the antenna shown in FIG. 2 can be used, only element pairs 42a and 42b and 50a and 50b are employed. Over this frequency range, element pair 46a and 46b is not extended and does not form a part of the antenna. In a typical embodiment of an antenna shown in FIG. 2, element pair 42a and 42b is employed as a driven element and element pair 50a and 50b is employed as a passive element. In an embodiment where element pair 42a and 42b and element pair 50a and 50b are configured as a 2-element yagi antenna operable over a frequency range of about 30 MHz to about 55 MHz, tube pairs 44a and 44b and 52a and 52b will have a length of approximately 109" measured tip to tip.

Over a second portion of the frequency spectrum within which the antenna shown in FIG. 2 can be used, all three of element pairs 42a and 42b, 46a and 46b, and 50a and 50b are employed. Over this frequency range, element pairs 42a and 42b, 46a and 46b, and 50a and 50b are extended within the looped tubes 44a-44b and 52a-52b without significantly entering the looped portion of the tubes. Element pair 46a and 46*b* may extended to its longest length. In an embodiment where tube pairs 44*a* and 44*b*, 48*a* and 48*b*, and 52*a* and 52*b* have a length of approximately 109" measured tip to tip, element pair 42*a* and 42*b*, 46*a* and 46*b*, and 50*a* and 50*b* may be configured as a 3-element yagi antenna operable over a frequency range of about 55 MHz to about 200 MHz.

In the 2-element configuration, element pair 42*a* and 42*b* are used as a driven element and element pair 50*a* and 50*b* are used as a passive element. In the 3-element configuration, element pair 46*a* and 46*b* are used as a driven element and element pairs 42*a* and 42*b* and 50*a* and 50*b* are used as passive elements. RF input relay 62 and shorting relay 64 are associated with element pair 42*a* and 42*b*. RF input relay 62 is energized when element pair 42*a* and 42*b* are used as a driven element and shorting relay 64 is energized when element pair 42*a* and 42*b* are used as a passive element. Element pair 46*a* and 46*b* are either retracted and do not form a part of the 2-element antenna, or are used as the driven element in the 3-element configuration. Antenna relay 66 is energized when the antenna 40 is employed in the 2-element configuration to direct incoming RF energy to driven element pair 42*a* and 42*b* and antenna relay 68 is energized when the antenna 40 is employed in the 3-element configuration to direct incoming RF energy to driven element pair 46*a* and 46*b*. Element pair 50*a* and 50*b* are always used as a passive element and the brushes associated with the reels in this element pair are always connected together as a short circuit.

Figure 3:
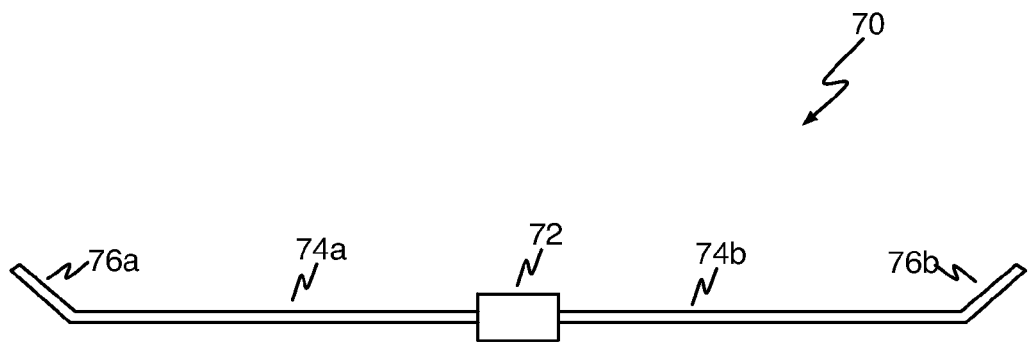
FIG. 3 is a diagram showing an end view of an illustrative adjustable EMC antenna according to the present invention.

Some existing EMC testing environments have limited volume. Modifying these environments can be considerably expensive. According to another aspect of the present invention, an EMC testing antenna system can be configured to be accommodated in existing EMC testing environments. Referring now to FIG. 3, a diagram shows an end view of an illustrative adjustable EMC antenna 70 according to the present invention. The frontmost element (not shown in this view) is driven by length-adjusting mechanism 72 into opposing tube segments 74*a* and 74*b*. The end portions 76*a* and 76*b* of tube segments 74*a* and 74*b*, respectively, are angled up (or down) out of the element plane. In a particular embodiment, about 10% of the overall length of the element at the outer end is angled upwards at an angle of about 40°. Using this configuration, the embodiment described above having an overall element length of approximately 109" measured tip to tip, can be reduced by about 8" to about 101".

Figure 4:
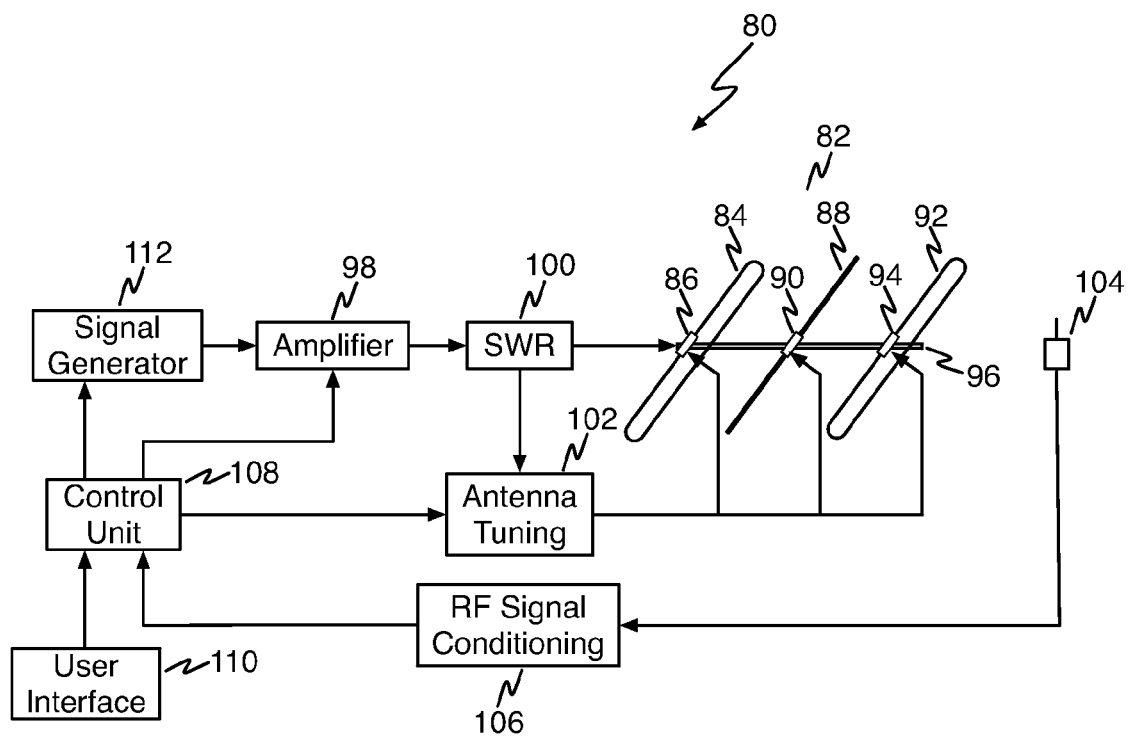
FIG. 4 is a diagram showing an illustrative adjustable EMC antenna system according to the present invention.

The above-described antenna can be integrated into a novel complete EMC testing system that has not been possible to configure using prior art methods and components. Referring now to FIG. 4, a block diagram shows an illustrative adjustable EMC testing system 80 according to the present invention.

EMC testing system 80 is built around length-adjustable antenna system 82 including an antenna formed from length-adjustable element 84 employing length-adjustment mechanism 86, length-adjustable element 88 employing length-adjustment mechanism 90, and length-adjustable element 92 employing length-adjustment mechanism 94, mounted on boom 96.

RF amplifier 98, which may be mounted on boom 96 with the antenna, drives antenna system 82 through SRW measuring device 100. The output signal from SWR measuring device 100 is provided as a feedback signal to antenna tuning system 102. Antenna tuning system 102 may be of the type marketed and sold by Fluid Motion, Inc., of Bellevue, Wash. as the SDA 100 Controller including an SWR error signal servo loop routine to drive the length-adjusting mechanisms 86, 90, and 94 to minimize the SWR in the coupling between RF amplifier 98 and antenna system 82. Such routines are known in the art and may be provided to such controllers as a matter of routine engineering skill.

E-field sensor 104 is placed at a desired distance from the antenna system 82 to measure the e-field strength at that location. E-field sensors are known in the art. The output signal from e-field sensor 104 is first conditioned in RF signal conditioning circuit 106 as is known in the art and then sent to control unit 108. Control unit 108 can use the output signal from e-field sensor 104 in a servo control loop to control the gain of RF amplifier 98 to generate an e-field of a desired magnitude at the location of sensor 104. The desired level may be set by a user input to user interface 110. User interface 110 is also coupled to a signal generator 112, which may be integrated into the system 80 or simply used to drive the RF amplifier of the system 80. Parameters in addition to desired RF output level of RF amplifier 98 and antenna system 82, such as frequency, duration, modulation, etc. may be set at user interface 100.

The antenna system and EMC test system of the present invention can generate very high E fields to facilitate susceptibility testing that conforms to new stricter standards which specify that little or no harmonic energy be present. The antenna system and EMC test system of the present invention eliminate the need to employ impractical power levels that are required by presently-utilized antenna/amplifier combinations and eliminate the requirement that the antenna be moved many times at every frequency test point to cover the required illumination of the equipment under test. This eliminates the many additional hours that have been needed to perform the test and using the antenna and amplifier combinations currently known in the art and eliminates the serious problem of emitted RF energy at harmonic frequencies often exceeding emissions at the desired test frequency.

Presently-used shielded EMC test rooms cause a multitude of "room effects" that severely affect the input impedance of the antenna resulting in very high standing waves that put a tremendous strain on the amplifier, but more importantly cause the amplifier to greatly increase it's harmonic output. The present invention including a tunable antenna with an appropriate feedback system as described herein can virtually eliminate this problem while greatly boosting system efficiency.

Unlike a log periodic which places the lowest frequency driven and passive elements farthest away from the EUT, the 2-element configuration of the present antenna system keeps the radiator closest to the EUT at the most difficult frequency range of about 30 MHz to about 80 MHz.

Radiated testing starts at 30 MHz and at that frequency a very large shielded room is required to accommodate a reasonably efficient antenna such as a half wave dipole, which is 16 feet wide at this frequency. These rooms are not practical for the vast majority of test facilities. The use of an adjustable antenna system of the present invention allows the already shortened element of existing tunable antennas to be altered in a variety of hitherto unachievable ways to shorten the antenna even further. As an example, the bending of the ends of the existing loops upward as disclosed herein shortens the antenna even further at very little expense in performance in either E-field strength or polarization shifting. Retaining pure horizontal/vertical radiation when placed in either mode is an important attribute and the element shapes disclosed here do not degrade these radiation properties.

In the reactive near field, the antenna system of the present invention has the unique ability to dynamically change element lengths to alter the E-field resulting in a substantial increase in magnitude in the direction of the EUT.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An antenna for electromagnetic compliance testing within a frequency range, the antenna comprising:
   a boom;
   a driven element including opposed first and second length-adjustable conductors deployed in opposite directions from a first length adjustment mechanism in a first housing mounted on the boom;
   a length-adjustable passive element mounted on the boom and spaced apart from the driven element and including opposed third and fourth length-adjustable conductors deployed in opposite directions from a second length adjustment mechanism in a second housing mounted on the boom;
   an RF input relay mounted on the first housing; and
   a feed path coupling the RF input relay to a feed end of the first and second length-adjustable conductors in the driven element, the feed path configured to minimize stray reactances and stub effects within the frequency range.

2. The antenna of claim 1 wherein:
   the frequency range is from about 30 MHz to about 200 MHz; and
   the length-adjustable passive element is spaced apart from the driven element by about 30 inches to about 40 inches.

3. The antenna of claim 1 wherein the driven element and the passive element are loop elements.

4. The antenna of claim 1 wherein about 10% of the distal ends of the driven element and the passive element are each angled at about 40° from a plane defined by the driven element and the passive element.

5. The antenna of claim 1 wherein:
   the first and second length-adjustable conductors of the length-adjustable driven element are each formed from conductive tape dispensed into hollow non-rf-conducting tubes from first and second conductive reels separated from one another and driven by separate stepper motors;
   the feed path includes a length of coaxial cable having a shield conductor and a center conductor each having first ends coupled to the RF input relay, the second end of the shield conductor connected to a first brush that directly contacts a side face of the first conductive reel and the second end of the center conductor connected to a second brush that directly contacts a side face of the second conductive reel; and
   the third and fourth length-adjustable conductors of the length-adjustable passive element are each formed from conductive tape dispensed into hollow non-rf-conducting tubes from third and fourth conductive reels separated from one another and driven by separate stepper motors, third and fourth brushes directly connecting the third conductive reel to the fourth conductive reel by a minimum length path.

6. The antenna of claim 1 further including:
   a second driven element mounted on the boom between the driven element and the passive element and including opposed fifth and sixth length-adjustable conductors;
   an antenna switch coupled to the RF input relay, the driven element and the second driven element to selectively connect the RF input relay to one of the driven element and the second driven element; and
   a shorting switch coupled between the opposed first and second length-adjustable conductors to connect together ends of the opposed first and second length-adjustable conductors closest to the boom by a minimum length path when the antenna switch is configured to connect the RF input relay to the second driven element.

7. The antenna of claim 6 wherein the fifth and sixth length-adjustable conductors of the length-adjustable second driven element are each formed from conductive tape dispensed into hollow non-rf-conducting tubes from fifth and sixth conductive reels separated from one another and driven by separate stepper motors; and
   a fifth brush coupled between the fifth length-adjustable conductor and the antenna switch, a sixth brush coupled between the sixth length-adjustable conductor and the antenna switch;
   fifth and sixth brushes coupling the third conductive reel to the fourth conductive reel by a minimum length path when the antenna switch is configured to connect the RF input relay to the driven element and coupling the third conductive reel and the fourth conductive reel to the RF input conductor when the antenna switch is configured to connect the RF input relay to the second driven element.

8. The antenna of claim 6 wherein a maximum length of the second driven element is about half of the maximum lengths of the driven element and the passive element.

9. The antenna of claim 8 wherein the driven element and the passive element are loop elements.

10. An antenna system for electromagnetic compliance testing comprising:
    a tunable antenna having a length-adjustable driven element, including opposed first and second length-adjustable conductors deployed in opposite directions from a length-adjustment mechanism, an RF input relay, and a feed path coupling the RF input relay to a feed end of the length-adjustable driven element, the feed path configured to minimize stray reactances and stub effects within the frequency range;
    a user interface for inputting control information;
    an RF amplifier mounted on or in close proximity to the antenna;
    an SWR measuring device coupled between the RF amplifier and the RF input relay of the tunable antenna;
    an antenna tuning controller coupled to SWR measuring device and to the antenna elements to adjust their lengths for minimum SWR;
    an e-field meter positioned to receive radiation emitted from the antenna; and
    a control unit having a user input coupled to the user interface, a sense input coupled to the e-field meter, an amplifier control output coupled to the RF amplifier, and a tuning control output coupled to the antenna tuning controller through an RF signal conditioning circuit.

11. The antenna system of claim 10 further including an RF signal generator having control input coupled to the user interface and an output coupled to the RF amplifier.

12. The antenna system of claim 10 wherein the e-field meter is coupled to the control unit through an RF signal conditioning circuit.

* * * * *